United States Patent
Chen et al.

(10) Patent No.: US 9,548,219 B2
(45) Date of Patent: Jan. 17, 2017

(54) SEMICONDUCTOR PACKAGE AND FABRICATION METHOD THEREOF AND CARRIER STRUCTURE

(71) Applicant: Siliconware Precision Industries Co., Ltd., Taichung (TW)

(72) Inventors: Yan-Heng Chen, Taichung (TW); Chung-Tang Lin, Taichung (TW); Chieh-Yuan Chi, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/584,428

(22) Filed: Dec. 29, 2014

(65) Prior Publication Data
US 2015/0325508 A1  Nov. 12, 2015

(30) Foreign Application Priority Data
May 9, 2014  (TW) .............................. 103116496 A

(51) Int. Cl.
| | |
|---|---|
| *H01L 21/48* | (2006.01) |
| *H01L 23/498* | (2006.01) |
| *H01L 21/56* | (2006.01) |
| *H05K 1/02* | (2006.01) |
| *H01L 23/00* | (2006.01) |

(52) U.S. Cl.
CPC ............ *H01L 21/48* (2013.01); *H01L 21/561* (2013.01); *H01L 23/49811* (2013.01); *H01L 23/49827* (2013.01); *H01L 23/49838* (2013.01); *H01L 24/97* (2013.01); *H05K 1/0298* (2013.01); *H01L 2224/16225* (2013.01); *H01L 2224/32225* (2013.01); *H01L 2224/73204* (2013.01); *H01L 2224/97* (2013.01); *H01L 2924/15174* (2013.01); *H01L 2924/15311* (2013.01); *H01L 2924/181* (2013.01)

(58) Field of Classification Search
CPC .... H01L 21/48; H01L 24/97; H01L 23/49838; H01L 23/49827; H01L 21/561; H01L 23/49811; H05K 1/0298
See application file for complete search history.

(56) References Cited

U.S. PATENT DOCUMENTS

| | | | |
|---|---|---|---|
| 2004/0212075 A1* | 10/2004 | Shiraishi | ............... H01L 21/563 257/700 |
| 2008/0217784 A1* | 9/2008 | Binder | .................. H01L 21/486 257/762 |

(Continued)

*Primary Examiner* — John P Dulka
(74) *Attorney, Agent, or Firm* — Mitz Levin Cohn Ferris Glovsky and Popeo, P.C.; Peter F. Corless; Steven M. Jensen

(57) ABSTRACT

A carrier structure is provided, which includes: a metal oxide plate having opposite first and second surfaces and a plurality of through holes penetrating the first and second surfaces; a plurality of conductive portions formed in the through holes, respectively; and a plurality of conductive pads formed on the first surface of the metal oxide plate, wherein each of the conductive pads is correspondingly positioned on and in contact with a plurality of the conductive portions so as to be electrically connected to the plurality of the conductive portions. By replacing a conventional silicon interposer with the metal oxide plate, the present invention eliminates the need to form through silicon vias as required in the prior art and therefore simplifies the fabrication process.

22 Claims, 5 Drawing Sheets

(56) References Cited

U.S. PATENT DOCUMENTS

2012/0032340 A1\* 2/2012 Choi .................... H01L 21/561
 257/774
2014/0117539 A1\* 5/2014 Karasawa ............... H01L 23/15
 257/737

\* cited by examiner

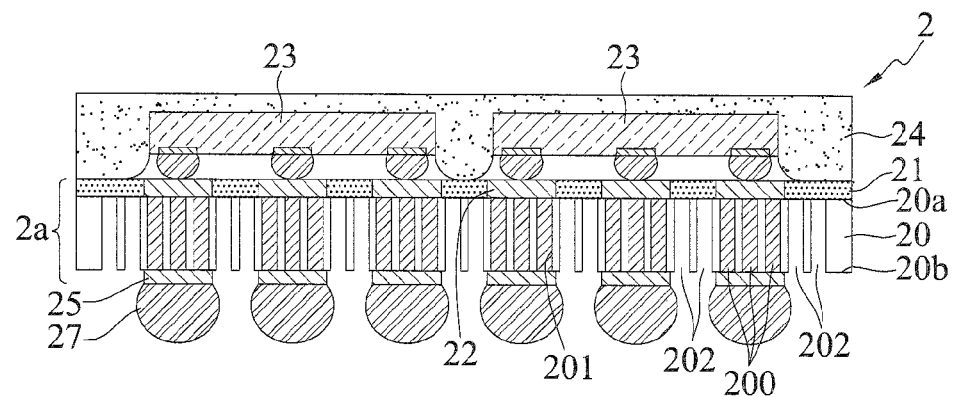
FIG.2G
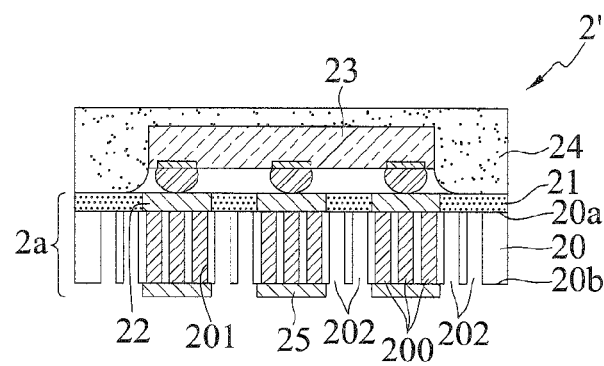
FIG.2G'
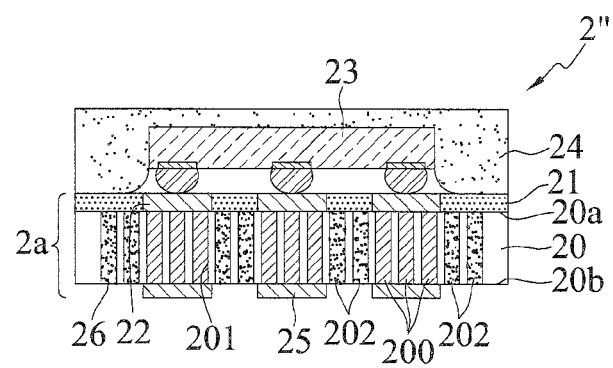
FIG.2G"

SEMICONDUCTOR PACKAGE AND FABRICATION METHOD THEREOF AND CARRIER STRUCTURE

BACKGROUND OF THE INVENTION

1. Field of the Invention

The present invention relates to semiconductor packages, and more particularly, to a semiconductor package and a fabrication method thereof for improving the product yield.

2. Description of Related Art

Along with the rapid development of electronic industries, electronic products are developed toward the trend of multi-function and high performance. Accordingly, there have been developed various types of flip-chip packaging modules such as chip scale packages (CSPs), direct chip attached (DCA) packages and multi-chip modules (MCM), and 3D IC chip stacking technologies.

FIGS. 1A to 1C are schematic cross-sectional views showing a method for fabricating a semiconductor package 1 according to the prior art.

Referring to FIG. 1A, a silicon substrate 10' is provided and a plurality of through holes 100a are formed in the silicon substrate 10'.

Referring to FIG. 1B, a dielectric material 100b is formed in the through holes 100a first and then a metal material is filled in the through holes 100a, thus forming a silicon interposer 10 having a plurality of through silicon vias (TSVs) 100.

Referring to FIG. 1C, an RDL (Redistribution Layer) structure 15 is formed on a first surface of the silicon interposer 10.

Then, a semiconductor chip 11 having a plurality of electrode pads 110 is flip-chip disposed on a second surface of the silicon interposer 10 opposite to the first surface. The electrode pads 110 are electrically connected to the TSVs 100 of the silicon interposer 10 through a plurality of u-bumps 13. Thereafter, an underfill 12 is formed between the semiconductor chip 11 and the silicon interposer 10 for encapsulating the u-bumps 13.

Then, an encapsulant 16 is formed on the silicon interposer 10 for encapsulating the semiconductor chip 11.

Thereafter, a packaging substrate 18 having a plurality of bonding pads 180 is attached to the first surface of the silicon interposer 10 through the RDL structure 15. In particular, the RDL structure 15 is electrically connected to the bonding pads 180 through a plurality of conductive elements 17 having a large pitch. Further, an underfill 12 is formed between the RDL structure 15 and the packaging substrate 18 for encapsulating the conductive elements 17.

If the semiconductor chip 11 is directly attached to the packaging substrate 18, a big CTE (Coefficient of Thermal Expansion) mismatch between the semiconductor chip 11 and the packaging substrate 18 adversely affects the formation of joints between conductive bumps of the semiconductor chip 11 and the bonding pads 180 of the packaging substrate 18, thus easily resulting in delamination of the conductive bumps from the packaging substrate 18. On the other hand, the CTE mismatch between the semiconductor chip 11 and the packaging substrate 18 induces more thermal stresses and leads to more serious warpage, thereby reducing the reliability of electrically connection between the semiconductor chip 11 and the packaging substrate 18 and resulting in failure of a reliability test.

Therefore, the silicon interposer 10 close in material to the semiconductor chip 11 is disposed between the semiconductor chip 11 and the packaging substrate 18 so as to effectively overcome the above-described drawbacks.

Further, the silicon interposer 10 facilitates to reduce the area of the semiconductor package 1. For example, a packaging substrate generally has a minimum line width/pitch of 12/12 um. When the I/O count of a semiconductor chip increases, since the line width/pitch of the packaging substrate cannot be reduced, the area of the packaging substrate must be increased such that more circuits can be formed on the packaging substrate and electrically connected to the semiconductor chip. On the other hand, referring to FIG. 1, through a semiconductor process, the silicon interposer 10 can have a line width/pitch of 3/3 um or less. Therefore, the semiconductor chip 11 having a high I/O count can be disposed on the silicon interposer 10 without the need to increase the area of the packaging substrate 18.

However, to form the TSVs 100 of the silicon interposer 10, a plurality of through holes 100a need to be formed in the silicon substrate 10' through a patterning process such as exposure, development and etching and then filled with metal, which incurs a high cost. For example, for a 12-inch wafer, the TSV cost occupies about 40 to 50% of the total cost for fabricating the silicon interposer 10 (not including labor cost). Further, the fabrication process of the TSVs is time-consuming, especially when the silicon substrate 10' is etched to form the through holes 100a. Consequently, the cost of the final product is increased.

Therefore, how to overcome the above-described drawbacks has become critical.

SUMMARY OF THE INVENTION

In view of the above-described drawbacks, the present invention provides a carrier structure, which comprises: a metal oxide plate having opposite first and second surfaces and a plurality of first through holes penetrating the first and second surfaces; a plurality of conductive portions formed in the first through holes, respectively; and a plurality of first conductive pads formed on the first surface of the metal oxide plate, wherein each of the first conductive pads is correspondingly positioned on and in contact with a plurality of the conductive portions so as to be electrically connected to the plurality of the conductive portions.

The present invention further provides a semiconductor package, which comprises: a metal oxide plate having opposite first and second surfaces and a plurality of first through holes penetrating the first and second surfaces; a plurality of conductive portions formed in the first through holes, respectively; a plurality of first conductive pads formed on the first surface of the metal oxide plate, wherein each of the first conductive pads is correspondingly positioned on and in contact with a plurality of the conductive portions so as to be electrically connected to the plurality of the conductive portions; and at least a semiconductor element disposed on the first surface of the metal oxide plate and electrically connected to the first conductive pads.

The present invention further provides a method for fabricating a semiconductor package, which comprises the steps of: providing a metal oxide plate having opposite first and second surfaces and a plurality of first through holes penetrating the first and second surfaces; forming a conductive material in each of the first through holes so as to form a plurality of conductive portions; forming a plurality of first conductive pads on the first surface of the metal oxide plate, wherein each of the first conductive pads is correspondingly positioned on and in contact with a plurality of the conduc-
tive portions so as to be electrically connected to the plurality of the conductive portions; and disposing at least a semiconductor element on the first surface of the metal oxide plate, wherein the semiconductor element is electrically connected to the first conductive pads.

In the above-described method, the metal oxide plate can be fabricated by performing an oxidation-reduction process on a metal plate so as to form the first through holes in the metal plate when the metal plate is oxidized.

After disposing the semiconductor element on the first surface of the metal oxide plate, the above-described method can further comprise performing a singulation process.

In the above-described semiconductor package and method, an encapsulant can be formed on the first surface of the metal oxide plate for encapsulating the semiconductor element.

In the above-described semiconductor package, method and carrier structure, the metal oxide plate can be an aluminum oxide plate.

In the above-described semiconductor package, method and carrier structure, the first through holes can be arranged in clusters.

In the above-described semiconductor package, method and carrier structure, a plurality of second through holes can be formed in the metal oxide plate and penetrating the first and second surfaces of the metal oxide plate. The second through holes can be positioned between the first conductive pads and regularly arranged. Further, a dielectric material can be formed in the second through holes.

In the above-described semiconductor package, method and carrier structure, an insulating layer can be formed on the first surface of the metal oxide plate and the first conductive pads can be exposed from the insulating layer.

In the above-described semiconductor package, method and carrier structure, a plurality of second conductive pads can be formed on the second surface of the metal oxide plate, and each of the second conductive pads can be correspondingly positioned on and in contact with a plurality of the conductive portions so as to be electrically connected to the plurality of the conductive portions.

Therefore, by replacing a conventional silicon interposer with the metal oxide plate, the present invention eliminates the need to form TSVs as required in the prior art, thus greatly reducing the cost for fabricating the semiconductor package or the carrier structure, simplifying the fabrication process and increasing the production efficiency.

BRIEF DESCRIPTION OF DRAWINGS

FIGS. 2A to 2G are schematic cross-sectional views showing a method for fabricating a semiconductor package according to the present invention, wherein FIGS. 2A' and 2C' (an insulating layer is omitted) are schematic upper views of the structures of FIGS. 2A and 2C, respectively, and FIGS. 2G' and 2G" are schematic cross-sectional views showing different embodiments of FIG. 2G.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2G are schematic cross-sectional views showing a method for fabricating a semiconductor package 2 according to the present invention.

Figure 1A:
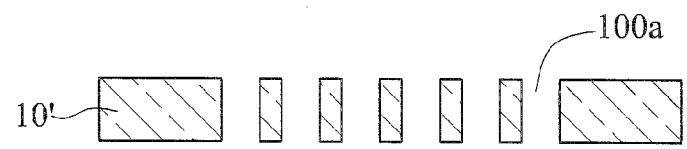
FIGS. 1A to 1C are schematic cross-sectional views showing a method for fabricating a semiconductor package according to the prior art.
Figure 1B:
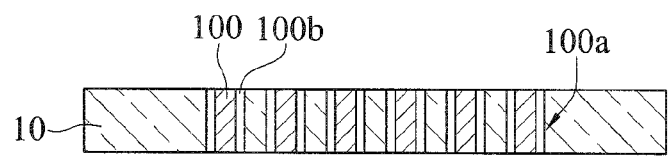
Figure 1C:
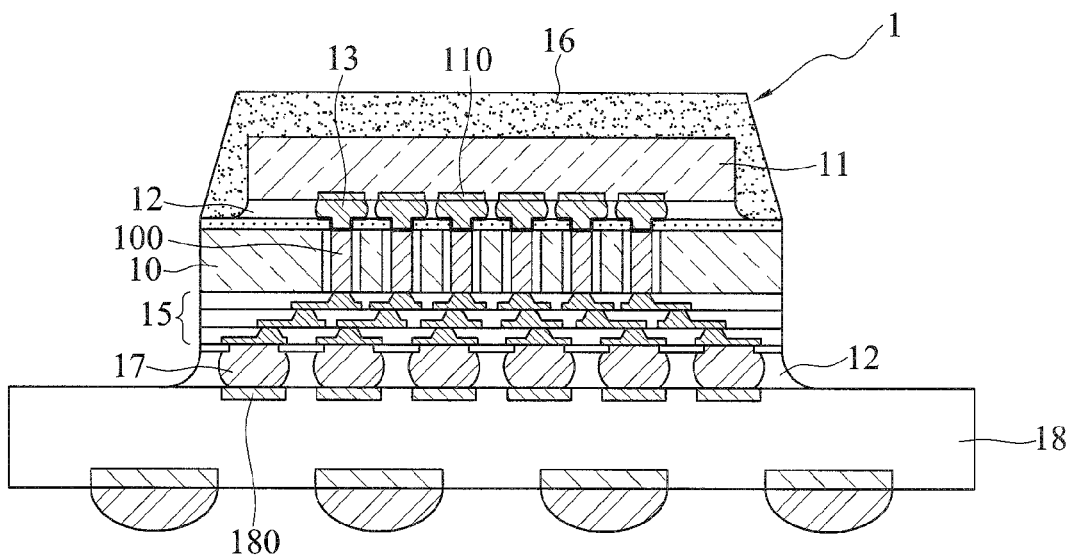
Figure 2A:
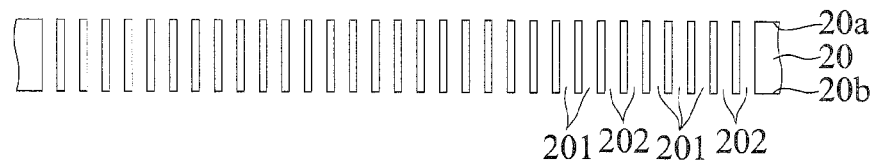
Figure 2A:
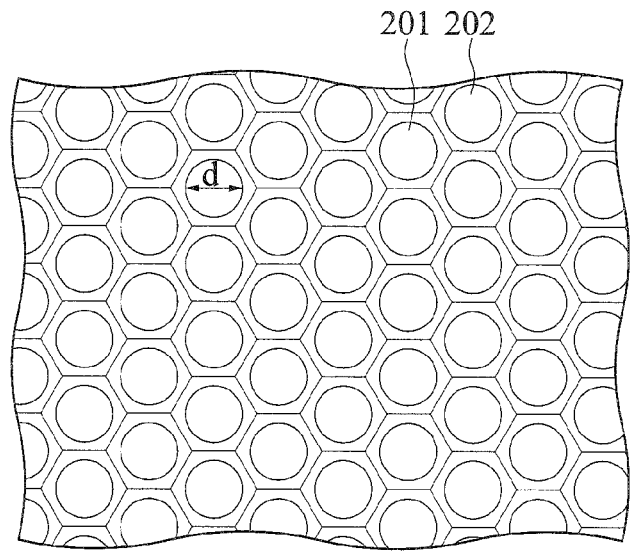

Referring to FIG. 2A, a metal oxide plate 20 having opposite first and second surfaces 20a, 20b is provided, and a plurality of first through holes 201 are formed to penetrate the first and second surfaces 20a, 20b of the metal oxide plate 20.

In the present embodiment, a plurality of second through holes 202 are further formed in the metal oxide plate 20 and penetrate the first and second surfaces 20a, 20b of the metal oxide plate 20.

The metal oxide plate 20 is an anodic aluminum oxide (AAO) plate. To fabricate the aluminum oxide plate, an aluminum plate is put into a chemical solution and an oxidation-reduction process is performed on the aluminum plate. When the aluminum plate is oxidized to form the aluminum oxide plate, a plurality of through holes (i.e., the through holes 201, 202) at nano scale are formed in and penetrate the aluminum oxide plate. The first and second through holes 201, 202 have a diameter d of 60 nm. The first and second through holes 201, 202 are naturally formed through the oxidation-reduction process and regularly arranged. For example, the through holes 201, 202 are alternately arranged and beehive shaped.

Figure 2B:
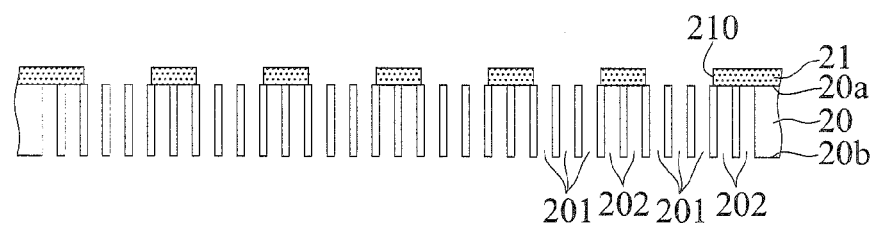

Referring to FIG. 2B, an insulating layer 21 is formed on the first surface 20a of the metal oxide plate 20.

In the present embodiment, a plurality of openings 210 are formed in the insulating layer 21, and each of the openings 210 exposes a plurality of the first through holes 201. The second through holes 202 are covered by the insulating layer 21.

Figure 2C:
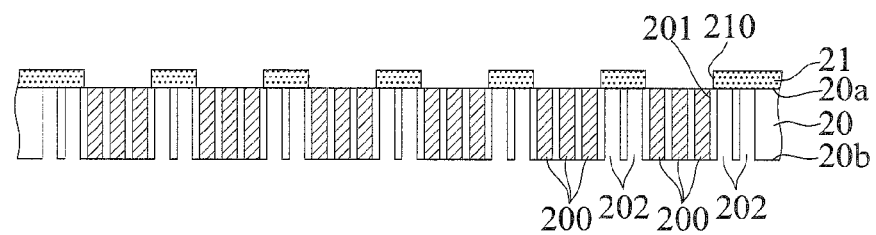
Figure 2C:
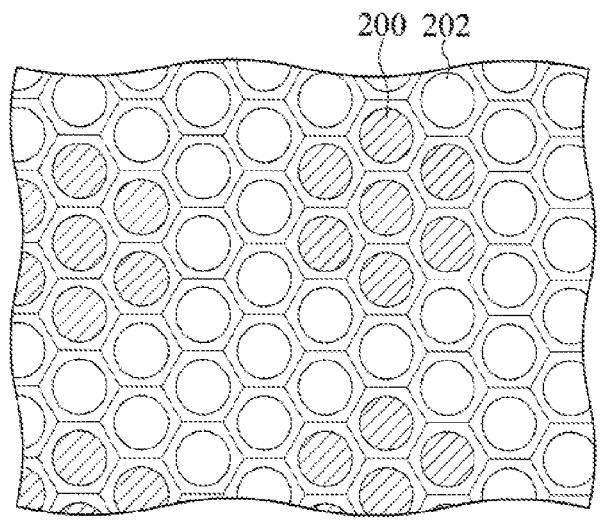

Referring to FIGS. 2C and 2C', a conductive material is formed in each of the first through holes 201 so as to form a plurality of conductive portions 200.

In the present embodiment, the conductive material is electroplated copper. The second through holes 202 are not filled with the conductive material and therefore the second through holes 202 remain hollow.

Through the oxidation-reduction process, a plurality of through holes perpendicular to the surfaces of the metal oxide plate 20 are formed, which facilitates filling of a nano-material (i.e., the conductive material).

Further, the metal oxide plate 20 can be easily integrated with a semiconductor material such as silicon or glass. Therefore, the metal oxide plate 20 can be attached to a carrier made of a semiconductor material before a copper electroplating process is performed to form the conductive portions 200.

Furthermore, since the first through holes 201 are arranged in clusters, the conductive portions 200 are also formed in clusters.

Figure 2D:
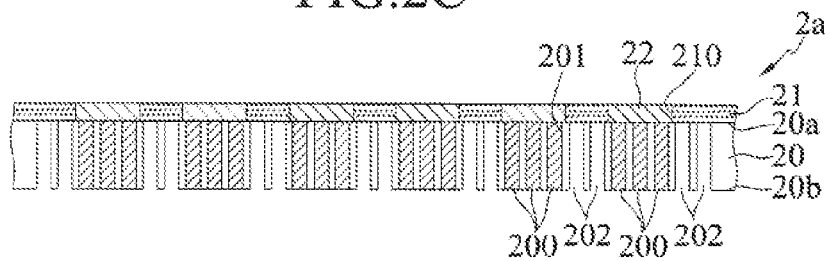

Referring to FIG. 2D, a plurality of first conductive pads 22 are formed on the first surface 20a of the metal oxide plate 20, thus forming a carrier structure 2a of the present invention. In particular, the first conductive pads 22 are formed in the openings 210 of the insulating layer 21, respectively. Therefore, each of the first conductive pads 22 is correspondingly positioned on and in contact with a plurality of the conductive portions 200 so as to be electrically connected to the plurality of the conductive portions 200.

In the present embodiment, the first conductive pads 22 are formed in the openings 210 and exposed from the insulating layer 21.

Each of the conductive portions 200 is at nano-scale and does not facilitate current conduction. Therefore, the conductive portions 200 are arranged in clusters to facilitate current to flow therethrough.

Further, the second through holes 202 are positioned between the first conductive pads 22, i.e., between the nano-scale clusters of the conductive portions 200.

Figure 2E:
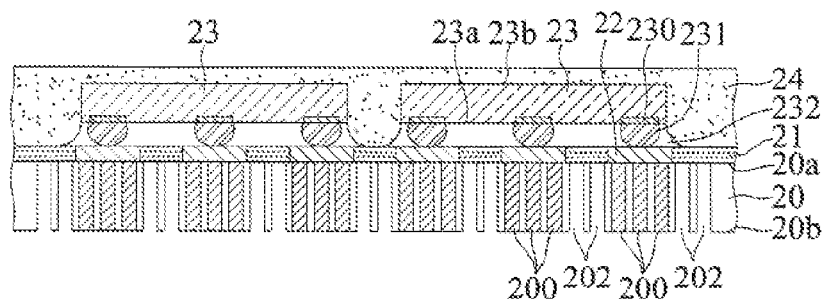

Referring to FIG. 2E, a plurality of semiconductor elements 23 are disposed on the first surface 20a of the metal oxide plate 20 and electrically connected to the first conductive pads 22. Then, an encapsulant 24 is formed on the first surface 20a of the metal oxide plate 20 for encapsulating the semiconductor elements 23.

In the present embodiment, the semiconductor elements 23 are semiconductor chips. Each of the semiconductor elements 23 has an active surface 23a with a plurality of electrode pads 230 and an inactive surface 23b opposite the active surface 23a. The electrode pads 230 of the semiconductor elements 23 are bonded to the first conductive pads 22 through a plurality of conductive bumps 231 made of such as a solder material.

Further, an underfill 232 is formed between the active surfaces 23a of the semiconductor elements 23 and the insulating layer 21 (or the first surface 20a of the metal oxide plate 20) for encapsulating the conductive bumps 231. Alternatively, the conductive bumps 231 are encapsulated by the encapsulant 24.

Figure 2F:
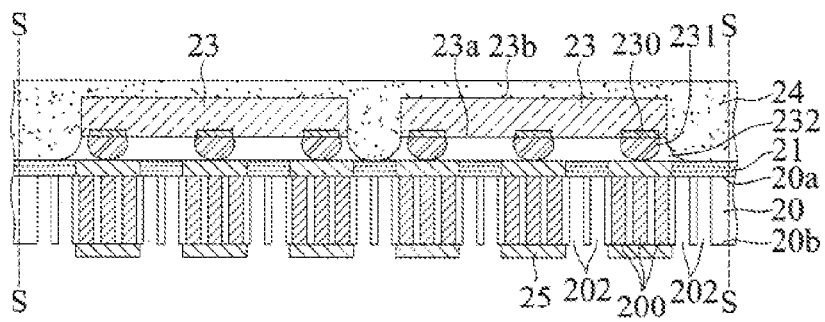

Referring to FIG. 2F, a plurality of second conductive pads 25 are formed on the second surface 20b of the metal oxide plate 20. Each of the second conductive pads 25 is correspondingly positioned on and in contact with a plurality of the conductive portions 200 so as to be electrically connected to the plurality of the conductive portions 200.

Referring to FIG. 2G, a plurality of conductive elements 27 such as solder balls are formed on the second conductive pads 25, and a singulation process is performed along a cutting path S of FIG. 2F. As such, a semiconductor package 2 is formed.

In the present embodiment, the semiconductor package 2 has a plurality of semiconductor elements 23. In another embodiment, referring to FIG. 2G', the semiconductor package 2' only has one semiconductor element 23.

In a further embodiment, referring to FIG. 2G", a dielectric material 26 is formed on the second through holes 202. The dielectric material 26 is made of an organic material, such as polyimide, or an inorganic material, such as $SiO_2$ and $SiN_x$.

Therefore, through a simple oxidation-reduction process, the present invention can fabricate a large-area metal oxide plate 20. Further, the present invention eliminates the need to form TSVs as required in the prior art. That is, the present invention dispenses with the patterning and etching processes for forming TSVs in the prior art. Therefore, the present invention greatly reduces the fabrication cost and time, increases the production efficiency of the semiconductor package 2 and improves the product yield.

Figure 3:
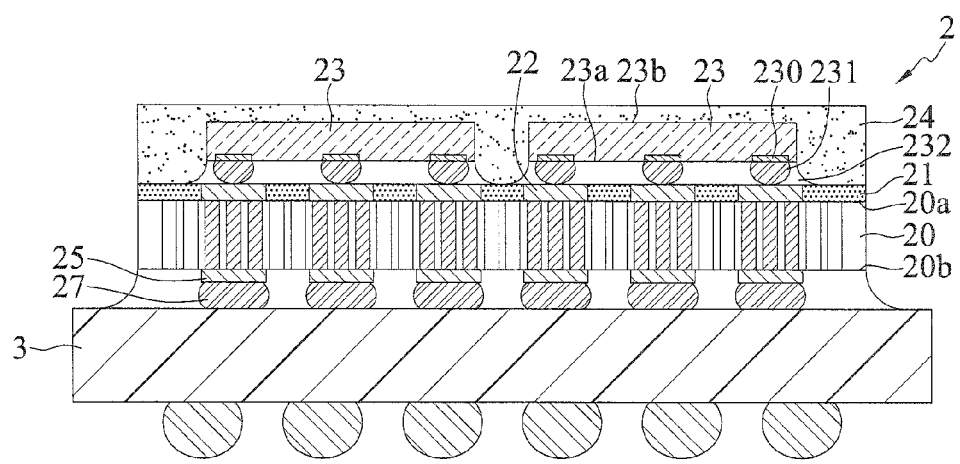
FIG. 3 is a schematic cross-sectional view showing processes performed after the process of FIG. 2G.

Referring to FIG. 3, continued from FIG. 2G the semiconductor package 2 is stacked on an electronic device 3 through the conductive elements 27. The electronic device 3 is, for example, a semiconductor element or a packaging substrate.

The present invention further provides a semiconductor package 2, 2', 2", which has: a carrier structure 2a, and at least a semiconductor element 23 disposed on the carrier structure 2a.

The carrier structure 2a has: a metal oxide plate 20 having opposite first and second surfaces 20a, 20b and a plurality of first through holes 201 penetrating the first and second surfaces 20a, 20b; a plurality of conductive portions 200 formed in the first through holes 201, respectively; and a plurality of first conductive pads 22 formed on the first surface 20a of the metal oxide plate 20, wherein each of the first conductive pads 22 is correspondingly positioned on and in contact with a plurality of the conductive portions 200 so as to be electrically connected to the plurality of the conductive portions 200.

The metal oxide plate 20 can be an aluminum oxide plate. The first through holes 201 can be arranged in clusters. A plurality of second through holes 202 are further formed in the metal oxide plate 20 and penetrating the first and second surfaces 20a, 20b of the metal oxide plate 20. The first and second through holes 201, 202 can be regularly arranged. The second through holes 202 can be positioned between the first conductive pads 22. The second through holes 202 can be hollow, or a dielectric material 26 can be formed in the second through holes 202.

An insulating layer 21 can be formed on the first surface 20a of the metal oxide plate 20 and the first conductive pads 22 can be exposed from the insulating layer 21.

The carrier structure 2a can further have a plurality of second conductive pads 25 formed on the second surface 20b of the metal oxide plate 20. Each of the second conductive pads 25 is correspondingly positioned on and in contact with a plurality of the conductive portions 200 so as to be electrically connected to the plurality of the conductive portions 200.

The semiconductor element 23 is disposed on the first surface 20a of the metal oxide plate 20 and electrically connected to the first conductive pads 22.

Further, an encapsulant 24 can be formed on the first surface 20a of the metal oxide plate 20 for encapsulating the semiconductor element 23.

Therefore, by replacing a conventional silicon interposer with the metal oxide plate, the present invention eliminates the need to form TSVs as required in the prior art, thus greatly reducing the cost for fabricating a semiconductor package, simplifying the fabrication process and increasing the production efficiency.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   a metal oxide plate having opposite first and second surfaces and a plurality of first through holes penetrating the first and second surfaces;
   a plurality of conductive portions formed in the first through holes, respectively;
   a plurality of first conductive pads formed on the first surface of the metal oxide plate, wherein each of the first conductive pads is correspondingly positioned on and in contact with a plurality of the conductive portions so as to be electrically connected to the plurality of the conductive portions;

at least a semiconductor element disposed on the first surface of the metal oxide plate and electrically connected to the first conductive pads through a plurality of conductive bumps; and an underfill formed between the semiconductor element and the first conductive pads and completely encapsulating the conductive bumps.

2. The package of claim 1, wherein the metal oxide plate is an aluminum oxide plate.

3. The package of claim 1, wherein the first through holes are arranged in clusters.

4. The package of claim 1, wherein a plurality of second through holes are formed in the metal oxide plate and penetrating the first and second surfaces of the metal oxide plate.

5. The package of claim 4, wherein the first and second through holes are regularly arranged.

6. The package of claim 4, wherein the second through holes are positioned between the first conductive pads.

7. The package of claim 4, further comprising a dielectric material formed in the second through holes.

8. The package of claim 1, further comprising an insulating layer formed on the first surface of the metal oxide plate and exposing the first conductive pads.

9. The package of claim 1, further comprising an encapsulant formed on the first surface of the metal oxide plate for encapsulating the semiconductor element.

10. The package of claim 1, further comprising a plurality of second conductive pads formed on the second surface of the metal oxide plate, wherein each of the second conductive pads is correspondingly positioned on and in contact with a plurality of the conductive portions so as to be electrically connected to the plurality of the conductive portions.

11. A method for fabricating a semiconductor package, comprising the steps of:

providing a metal oxide plate having opposite first and second surfaces and a plurality of first through holes penetrating the first and second surfaces;

forming a conductive material in each of the first through holes so as to form a plurality of conductive portions;

forming a plurality of first conductive pads on the first surface of the metal oxide plate, wherein each of the first conductive pads is correspondingly positioned on and in contact with a plurality of the conductive portions so as to be electrically connected to the plurality of the conductive portions;

disposing at least a semiconductor element on the first surface of the metal oxide plate, wherein the semiconductor element is electrically connected to the first conductive pads through a plurality of conductive bumps; and forming an underfill between the semiconductor element and the first conductive pads for completely encapsulating the conductive bumps.

12. The method of claim 11, wherein the metal oxide plate is fabricated by performing an oxidation-reduction process on a metal plate so as to form the first through holes in the metal plate when the metal plate is oxidized.

13. The method of claim 11, wherein the metal oxide plate is an aluminum oxide plate.

14. The method of claim 11, wherein the first through holes are arranged in clusters.

15. The method of claim 11, wherein the metal oxide plate further has a plurality of second through holes penetrating the first and second surfaces.

16. The method of claim 15, wherein the first and second through holes are regularly arranged.

17. The method of claim 15, wherein the second through holes are positioned between the first conductive pads.

18. The method of claim 15, further comprising forming a dielectric material in the second through holes.

19. The method of claim 11, further comprising forming an insulating layer on the first surface of the metal oxide plate, wherein the first conductive pads are exposed from the insulating layer.

20. The method of claim 11, further comprising forming an encapsulant on the first surface of the metal oxide plate for encapsulating the semiconductor element.

21. The method of claim 11, further comprising forming a plurality of second conductive pads on the second surface of the metal oxide plate, wherein each of the second conductive pads is correspondingly positioned on and in contact with a plurality of the conductive portions so as to be electrically connected to the plurality of the conductive portions.

22. The method of claim 11, after disposing the semiconductor element on the first surface of the metal oxide plate, further comprising performing a singulation process.

* * * * *